United States Patent [19]
Yoshida

[11] Patent Number: 5,584,940
[45] Date of Patent: Dec. 17, 1996

[54] FLEXIBLE PHOTOELECTRIC CONVERSION MODULE

[75] Inventor: Takashi Yoshida, Kanagawa, Japan

[73] Assignee: Fuji Electric Co., Ltd., Tokyo, Japan

[21] Appl. No.: 574,788

[22] Filed: Dec. 19, 1995

Related U.S. Application Data

[63] Continuation of Ser. No. 314,408, Sep. 28, 1994, abandoned.

[30] Foreign Application Priority Data

Sep. 28, 1993 [JP] Japan .................................. 5-240768

[51] Int. Cl.$^6$ .......................... H01L 31/048; H01L 31/05
[52] U.S. Cl. ........................................... 136/251; 136/244
[58] Field of Search ............................ 136/244, 251

[56] References Cited

U.S. PATENT DOCUMENTS

| | | | |
|---|---|---|---|
| 3,411,050 | 11/1968 | Middleton et al. | 136/245 |
| 4,443,652 | 4/1984 | Izu et al. | 136/251 |
| 4,537,838 | 8/1985 | Jetter et al. | 429/9 |
| 4,562,637 | 1/1986 | Kushima et al. | 219/121.64 |
| 4,773,944 | 9/1988 | Nath et al. | 136/249 |
| 4,860,509 | 8/1989 | Laaly et al. | 52/173.3 |
| 4,888,061 | 12/1989 | Wenz | 136/251 |
| 5,133,810 | 7/1992 | Morizane et al. | 136/251 |
| 5,273,608 | 12/1993 | Nath | 156/301 |

FOREIGN PATENT DOCUMENTS

| | | | |
|---|---|---|---|
| 0111394 | 6/1984 | European Pat. Off. | 136/251 |
| 3231798 | 3/1984 | Germany | 136/251 |
| 60-128647 | 7/1985 | Japan | 136/251 |
| 60-164348 | 8/1985 | Japan | 136/251 |
| 2042802 | 9/1980 | United Kingdom | 136/251 |

*Primary Examiner*—Aaron Weisstuch
*Attorney, Agent, or Firm*—Brumbaugh, Graves, Donohue & Raymond

[57] ABSTRACT

Thin-film photoelectric conversion elements are spaced from each other on an insulating belt-like film. Respective conductive tapes are soldered to the terminal electrodes at the two edges of the film. The conductive tape is in contact with non-adhesive resin in gap portions between the photoelectric conversion elements. For forming a module, the assembly can be cut at these portions, followed by removal of the non-adhesive resin to expose the conductive tape for external connection of the module.

7 Claims, 4 Drawing Sheets

FLEXIBLE PHOTOELECTRIC CONVERSION MODULE

This application is a continuation of application Ser. No. 08/314,408, filed on Sep. 28, 1994, now abandoned.

BACKGROUND OF THE INVENTION

The present invention relates to modules of semiconductor devices for converting light into electrical energy.

Flexible, lightweight photoelectric conversion elements have a flexible substrate, e.g., a high-molecular-weight film, and further include an amorphous silicon layer and electrode layers laminated on the substrate. Such an element can be brought into intimate contact with any desired curved shape. The amorphous silicon layer has a PIN-junction on the substrate. One of the electrode layers is transparent. Such photoelectric conversion elements can be combined into modules.

FIG. 2a and 2b show the front and rear surfaces, respectively, of a conventional photoelectric conversion module. A plurality (three in the figures) of submodules 21 are connected in series. The submodules are laminated with a surface-protecting film. A frame 22 is attached to the periphery for reinforcement. Electrical connection is via a terminal box 23 mounted on one surface.

In conventional photoelectric conversion modules, photoelectric conversion elements are laminated in a module having predetermined shape. This limits the size of the module. Where large-area coverage is desired as, e.g., on the roof of a building, many modules must be interconnected by lead wires in series and in parallel, or a connecting terminal box must be provided for each module. In the latter case, it is necessary to take out electrically connected portions from the module with conductive tape. The need for such connections lowers the manufacturing efficiency, impedes mass production, slows down installation, and impairs the reliability of power generation unless costly sealing is provided for wiring connections.

SUMMARY OF THE INVENTION

A preferred flexible photoelectric conversion module comprises a row of thin-film photoelectric conversion elements spaced from each other longitudinally and fixed on an insulating belt-like flexible substrate. Conductive tape is connected to the terminal electrodes at the respective ends of the photoelectric conversion elements, "ends" being understood to extend in a direction along the length of the substrate. Non-adhesive resin is in contact with at least one surface of the conductive tape in the gaps between the photoelectric conversion elements. Those portions of the photoelectric conversion elements and the conductive tape which are not coated with the non-adhesive resin are adhesively bonded to the substrate at one surface, and to insulating protective film at the other surface. Advantageously, plural rows of thin-film photoelectric conversion elements can be placed side by side, with conductive tape connecting adjacent terminal electrodes of the rows of thin-film photoelectric conversion elements.

Advantageously, an adhesive bond to the insulating substrate and to the insulating protective film can be made by a thermo-adhesive resin. As the non-adhesive resin, a fluorocarbon resin can be used to advantage. Preferably, the conductive tape is a metal foil having one surface coated with solder, for soldering of the tape to the terminal electrodes of the thin-film photoelectric conversion elements.

In a preferred method for connecting such a flexible photoelectric conversion module, the module is cut in one of the gaps between the thin-film photoelectric conversion elements, along a line passing through the non-adhesive resin. The non-adhesive resin is removed from the cut portion, thereby exposing the conductive tape. A connecting conductor is bonded to the exposed surface of the conductive tape. It is desirable then to cover the exposed surface of the conductive tape with a weatherproof material.

A preferred apparatus for fabricating the above-described flexible photoelectric conversion module comprises:

a mechanism for advancing the flexible insulating substrate, the thermo-adhesive resinous film, the conductive tape, and the insulating protective film;

a mechanism for placing the thin-film photoelectric conversion elements and the non-adhesive resin alternately on the thermo-adhesive resinous film while the thermo-adhesive resinous film laminated on the substrate is in motion;

a pressure-applying and heating mechanism for brazing the conductive tape to the terminal electrodes of the photoelectric conversion elements;

a mechanism for laminating the insulating protective film on a side of the thin-film photoelectric conversion elements and the conductive tape opposite to the substrate via the thermo-adhesive resinous film; and a pressure-applying and heating mechanism for bonding with the thermo-adhesive resin.

DETAILED DESCRIPTION OF PREFERRED EMBODIMENTS

A preferred photoelectric conversion module comprises plural thin-film photoelectric conversion elements spaced from each other longitudinally on an insulating belt-like flexible substrate. Conductive tape is connected to the terminal electrodes at the ends of the photoelectric conversion elements, "ends" being understood to extend in a direction along the length of the substrate, as indicated by a double arrow A in FIG. 1. Non-adhesive resin is adhesively bonded to the conductive tape in the gaps between the elements. The other portions are adhesively bonded to the substrate at one surface, the other surface being adhesively bonded to insulating protective film. The module is cut along a cutting line passing through the portion at which the conductive tape is in contact with the non-adhesive insulating resin. After cutting, the adhesive insulating resin is removed, thus exposing the conductive tape. This portion can be electrically connected. Then, for reliability of connection, the exposed portion of the conductive tape on the substrate can be coated with a weatherproof material. Also, modules can be interconnected via this exposed portion. A module can be fabricated in the form of a long belt and can be wound up. A module can be cut at any desired position. Thus, in wide-area coverage, labor can be eliminated which heretofore was required in placing and electrically connecting modules.

Figure 1:
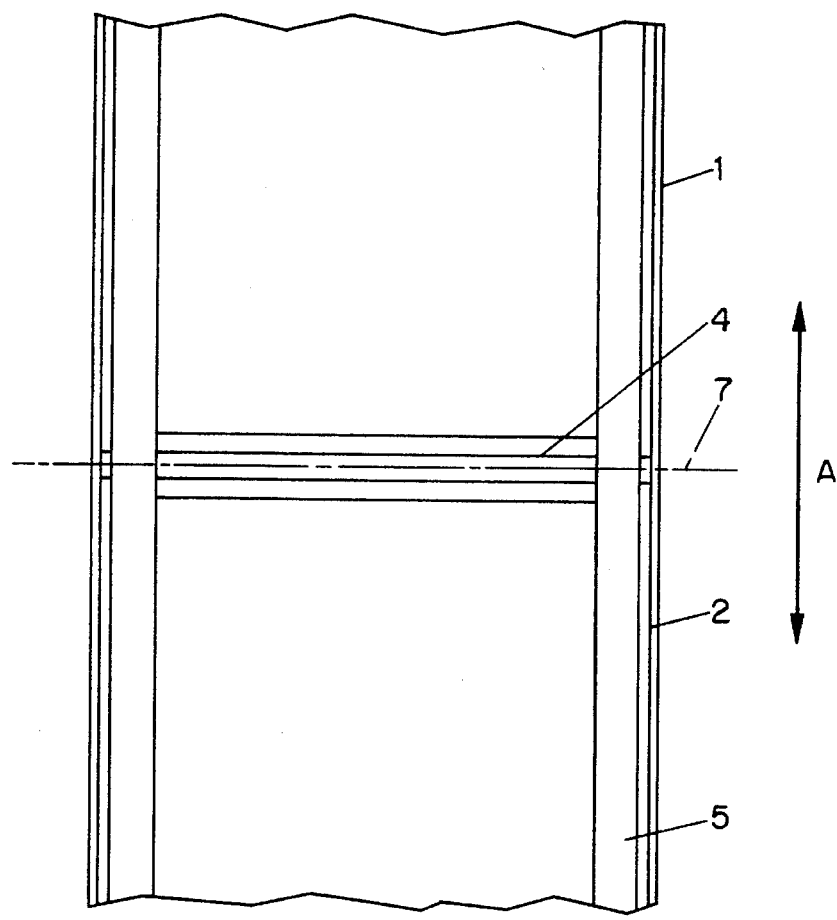
FIG. 1 is a schematic plan view of a representative portion of a flexible photoelectric conversion module in accordance with a preferred embodiment of the present invention.
Figures 2A, 2B:
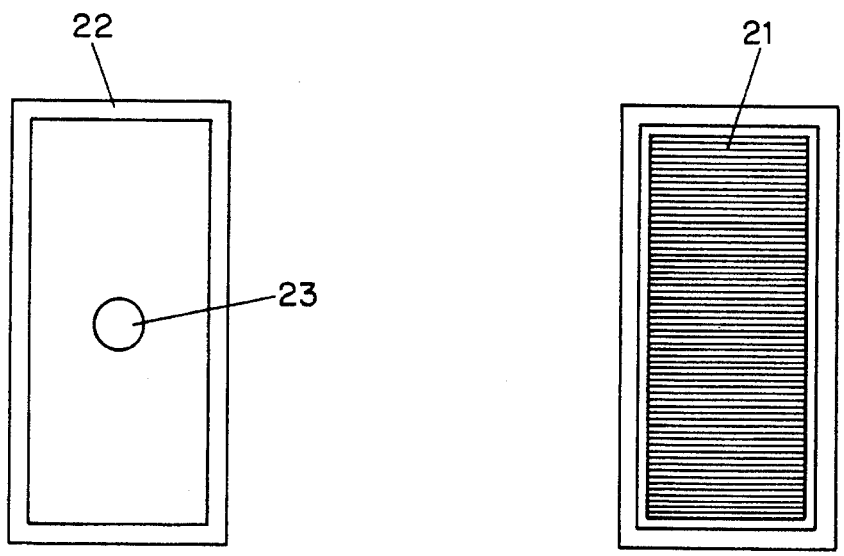
FIGS. 2a and 2b are plan and bottom views, respectively, of a conventional photoelectric conversion module.

FIG. 1 shows photoelectric conversion elements 3 fastened on a belt-shaped transparent film 1 by a thermo-adhesive resin 2 such as ethylene vinylacetate. Preferably, the film 1 is made of a fluorocarbon resin or other weatherproof material. The Photoelectric conversion elements 3 are spaced from each other. The center of a gap between conversion elements 3 is coated with a non-adhesive resin 4, such as a fluorocarbon resin, e.g., polytetrafluoroethylene. A conductive tape 5, such as copper foil, is soldered onto the terminal electrode portions at both ends of each photoelectric conversion element. Solder has been previously coated on one or both surfaces of the tape 5. Then, another layer of non-adhesive resin is placed over the non-adhesive resin 4 such that the conductive tape 5 is sandwiched between two sheets of resin. The non-adhesive resin 4 is formed across the whole module width, between the photoelectric conversion elements. Alternatively, it may be formed only at the parts occupied by the conductive tape. Thermo-adhesive resin and a weatherproof film may be placed on top. Heat may be applied continuously on one surface of the module to set the adhesive. Heat may also be applied after assembly to complete the module.

Figure 3A:
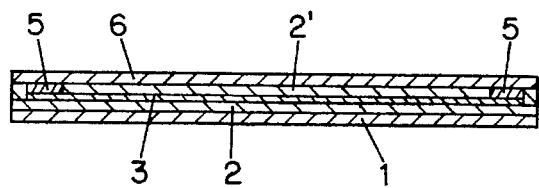
FIGS. 3a–3c are cross-sectional views showing cross-sectional structure of the module shown in FIG. 1 at three locations.
Figure 3B:
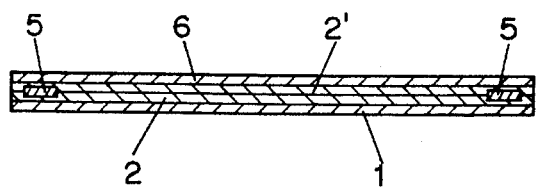
Figure 3C:
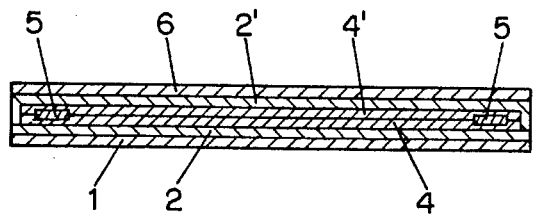

FIG. 3a shows a cross section of the photoelectric conversion element portion. FIG. 3b shows a cross section of a portion in which neither the photoelectric conversion element 3 nor the non-adhesive resin 4 is present. FIG. 3c shows a cross section of the, portion of the non-adhesive resin 4.

Shown in FIGS. 3a–3c are weatherproof transparent resinous film 1 such as a fluorocarbon resin, thermo-adhesive resin 2, 2', photoelectric conversion element 3, non-adhesive resin 4, 4', conductive tape 5, and weatherproof film 6. Bonding between the thermo-adhesive resin 2' and the weatherproof film 6 is by thermocompression.

In FIG. 3b, the thermo-adhesive resin 2' and weatherproof film 6 are shown as pressed against the conductive tape 5.

In FIG. 3c, the non-adhesive resin 4, 4' is shown coating the conductive tape 5. The thermo-adhesive resin 2' and resinous film 6 are pressed against the resin 4'.

The photoelectric conversion module can be cut into a desired length at the position of line 7 in FIG. 1. In the cut portion, the non-adhesive resin 4 is removed to expose the contact surface of the conductive tape 5. Connections can then be made. For electrical connection, lead wires can be connected directly to this connecting portion. Alternatively, the connecting portion may be provided with connecting terminals, and connections may be made at this portion. Also, modules may be connected directly. After connection, a lamination is made on the connecting portion, or the connecting portion is sealed by an adhesive or the like. Where no electrical connections are made, after the non-adhesive resin 4 is removed from the cut portion, the conductive tape 5 is cut into shorter portions and then a lamination is again applied, or the connecting portion is sealed by an adhesive or the like. In the structure shown in FIG. 3, the non-adhesive resin 4 coats both surfaces of the conductive tape 5. It is also possible to coat only one surface, in which case the other surface is exposed.

Figure 4:
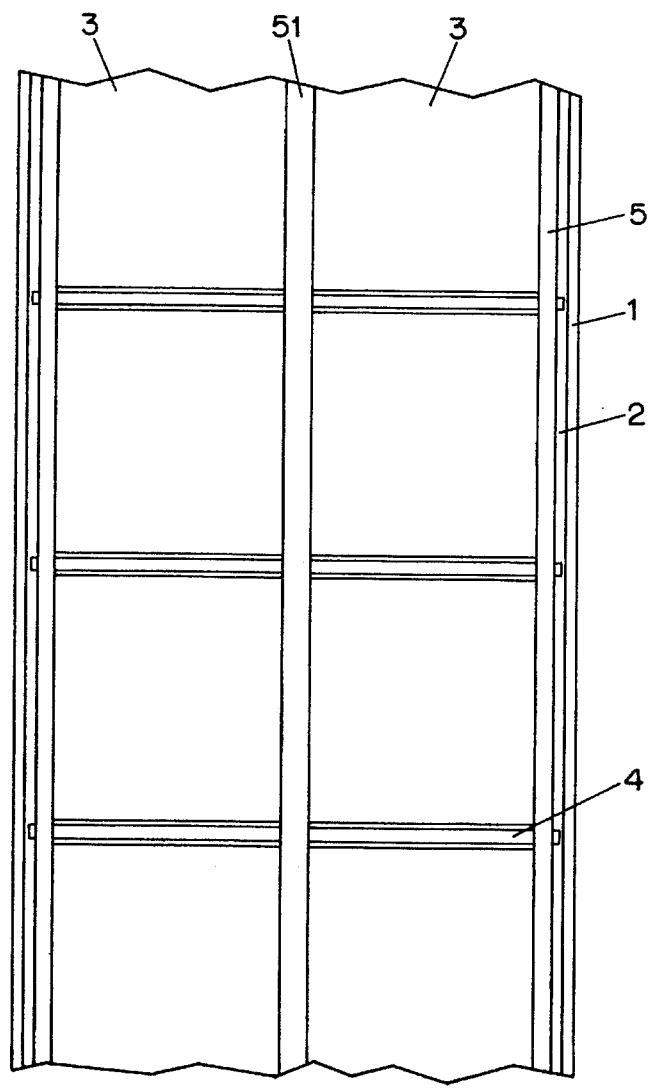
FIG. 4 is a schematic plan view of a representative portion of a flexible photoelectric conversion module in accordance with a preferred alternative embodiment of the present invention.

In the embodiment of FIG. 4, two rows of photoelectric conversion elements 3 are arranged side by side. Conductive tape 51 is provided at an intermediate position to interconnect the two rows of modules. If the terminal electrodes that are soldered to the conductive tape 51 have the same polarity, then the two rows of photoelectric conversion elements 3 are connected in parallel. If the electrodes are opposite in polarity, the two rows of photoelectric conversion elements 3 are connected in series. It is also possible to form photoelectric conversion elements in more than two rows. The width of the module can be enlarged as desired.

Figure 5A:
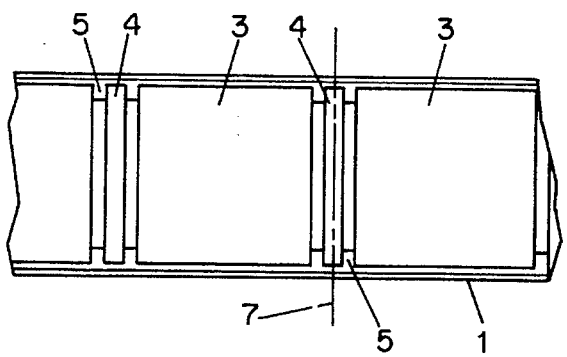
FIGS. 5a–5d are plan views illustrating the sequence in which the module of FIG. 1 is connected.
Figure 5B:
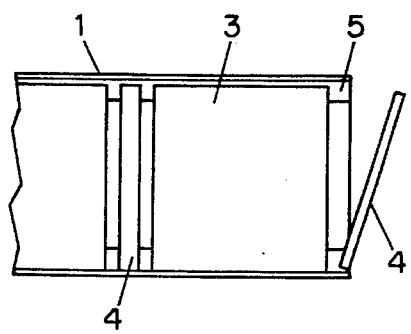
Figure 5C:
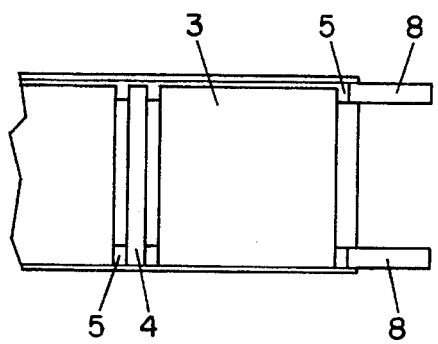
Figure 5D:
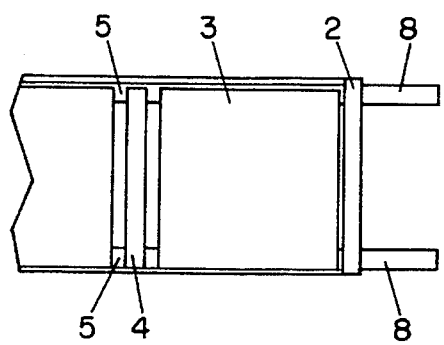

FIGS. 5a–5d illustrate a preferred sequence for connecting a module of the invention. First, the module is cut at a desired position along a cutting line 7 on the non-adhesive resin 4 (FIG. 5a). The non-adhesive resin 4 is removed from the cut portion to expose the conductive tape 5 (FIG. 5b). The solder surface of copper tape 8 is placed on one solder-coated surface of the conductive tape 5, and heat is applied to melt together the solder on the two tapes (FIG. 5c). The connecting portion of the conductive tape is coated with the thermo-adhesive resin 2, heat is applied, and the connecting portion is sealed (FIG. 5d). By this method, the module can be connected easily and with high reliability, to an external circuit or to another module. If desired, the module can be connected to a connecting terminal. In this method, thermo-adhesive resin originally on the module is used to seal the connecting portion. Alternatively or in combination, a sealing adhesive may be used. Also, a frame for an end portion may be mounted.

Figure 6:
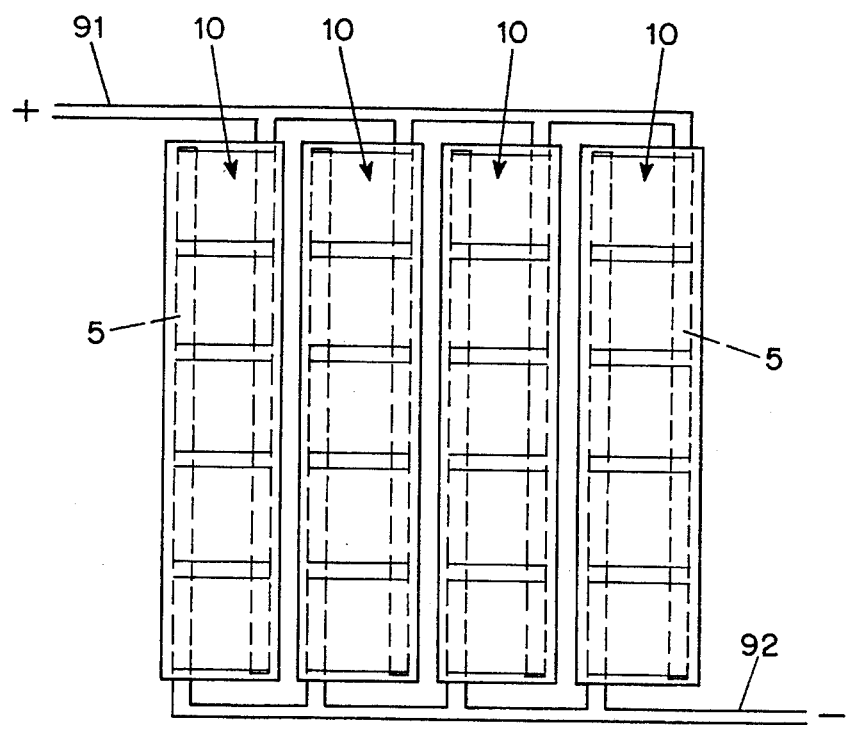
FIG. 6 is a plan view exemplifying electrical connection to the module of FIG. 1.

FIG. 6 illustrates a method for laying lead wires where the photoelectric conversion modules are arranged in a wide area. Modules 10 cut to dimensions to fit the installation site are laid so as to fully cover the site. A lead wire 91 is connected to the conductive tape on the positive terminal side of each module by the method illustrated in FIG. 5 to form a positive terminal for the assembly. Similarly, a lead wire 92 is connected to the conductive tape on the negative terminal side to form a negative terminal for the assembly.

Figure 7:
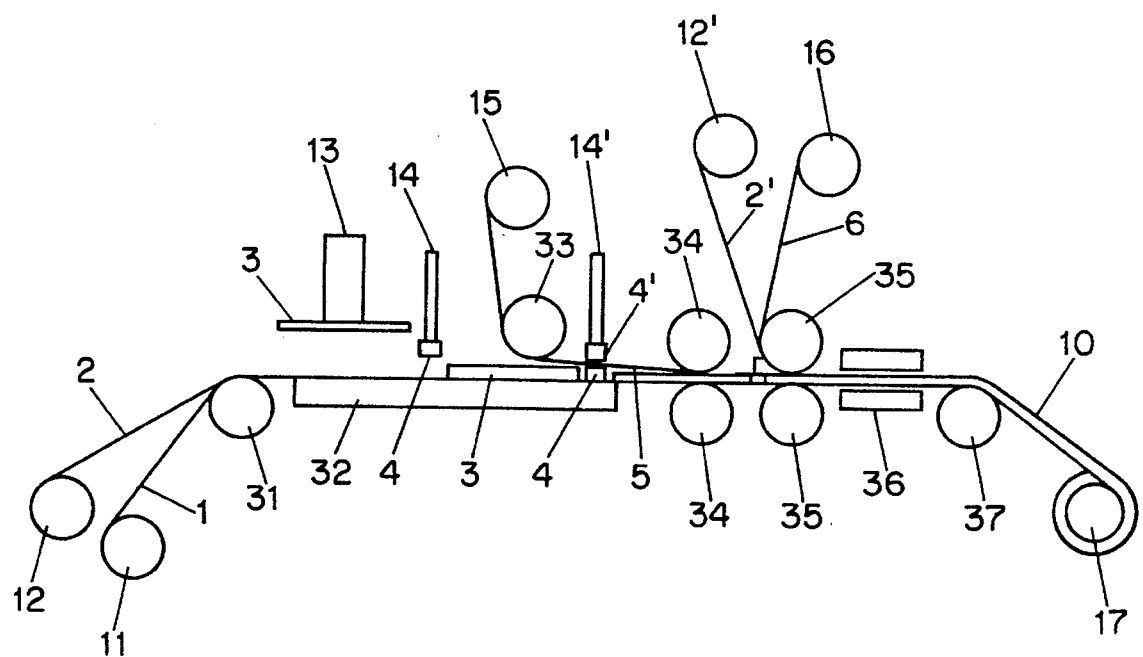
FIG. 7 is a side elevation of a module fabrication apparatus in accordance with a preferred embodiment of the invention.

FIG. 7 shows a preferred apparatus for fabricating a photoelectric conversion module of the invention. One side of the apparatus is equipped with a roll 11 for supplying transparent weatherproof film 1, and also with a roll 12 for supplying thermo-adhesive resin in the form of a film 2. The films 1 and 2 are placed on top of each other by passing them past a feed roller 31 and paid out. Supply devices 13 and 14 for placing the photoelectric conversion elements 3 and the non-adhesive resin 4 in an alternating, non-overlapping pattern on the films are mounted opposite to the support base 32. The conductive tape 5 is supplied from a supply roll 15 via a feed roller 33 onto the electrode terminals of the photoelectric conversion elements. Non-adhesive resin 4' is again supplied from a supply device 14' onto the previously positioned non-adhesive resin 4. Opposite thermocompression rollers 34 solder together the conductive tape 5 and the terminal electrode portion of the photoelectric conversion element 3. Also, a bond is made with the resin 2. Then, thermo-adhesive resin 2' is again paid out from a thermo-adhesive resin film supply roll 12'. Weatherproof film 6 is paid out from a weatherproof film supply roll 16. The films are placed on the photoelectric conversion element 3, the non-adhesive resin, and the conductive tape 5. They are bonded together thermally by opposite thermocompression rollers 35 and adhesively with the resin, and they are passed through a heater 36 to cure the resin. A resulting module 10 can be wound on a take-up roller 17 via a feed roller 37. Thus, a module structure shown in FIGS. 1, 3a–3c or 4 can be manufactured continuously, using this apparatus.

Preferably, the photoelectric conversion element supply device 13 and non-adhesive resin supply devices 14 and 14' are equipped with mechanisms for attracting supplied objects by vacuum attraction and advancing them toward a desired position under compressed-air pressure.

What is claimed is:

1. A flexible photoelectric conversion module comprising:
   a. a flexible belt-like insulating substrate having a major direction of elongation;
   b. a plurality of thin-film photoelectric conversion elements placed in the major direction on one side of the substrate, firmly secured to the substrate and spaced such that there are gaps between adjacent photoelectric conversion elements, each of the photoelectric conversion elements having first and second terminal electrodes at respective ends of said elements extending along the major direction;
   c. a conductive tape extending along the major direction and electrically connected to the first terminal electrodes;
   d. a non-adhesive resin in contact with at least one surface of the conductive tape in the gaps between adjacent photoelectric conversion elements; and
   e. an insulating protective film firmly secured to those portions of the photoelectric conversion elements and the conductive tape which are not in contact with the non-adhesive resin, the film being secured on the surfaces facing away from the substrate.

2. The flexible photoelectric conversion module of claim 1, further comprising another conductive tape extending along the major direction and electrically connected to the second terminal electrodes.

3. The flexible photoelectric conversion module of claim 1, wherein the thin-film photoelectric conversion elements are arranged in plural rows on the substrate.

4. The flexible photoelectric conversion module of 3, wherein the conductive tape is connected commonly to adjacent terminal electrodes of each row of the thin-film photoelectric conversion elements.

5. The flexible photoelectric conversion module of claim 1, wherein the insulating substrate and the insulating protective film are secured with a thermo-adhesive resin bond.

6. The flexible photoelectric conversion module of claim 1, wherein the non-adhesive resin is a fluorocarbon resin.

7. The flexible photoelectric conversion module of claim 1, wherein the conductive tape is a metal foil having one surface coated with solder, and is soldered to the terminal electrodes of the thin-film photoelectric conversion elements.

\* \* \* \* \*